United States Patent
Gunderson

(10) Patent No.: US 9,348,535 B1
(45) Date of Patent: May 24, 2016

(54) COMPRESSION FORMAT DESIGNED FOR A VERY FAST DECOMPRESSOR

(71) Applicant: GOOGLE INC., Mountain View, CA (US)

(72) Inventor: Steinar Heimdal Gunderson, Zurich (CH)

(73) Assignee: GOOGLE INC., Mountain View, CA (US)

( * ) Notice: Subject to any disclaimer, the term of this patent is extended or adjusted under 35 U.S.C. 154(b) by 287 days.

(21) Appl. No.: 14/201,562

(22) Filed: Mar. 7, 2014

(51) Int. Cl.
G06F 12/00 (2006.01)
G06F 3/06 (2006.01)
G06F 12/08 (2016.01)
G06F 12/10 (2016.01)
G06F 12/02 (2006.01)

(52) U.S. Cl.
CPC .............. *G06F 3/065* (2013.01); *G06F 3/0604* (2013.01); *G06F 3/0683* (2013.01); *G06F 12/0207* (2013.01); *G06F 12/0292* (2013.01); *G06F 12/0886* (2013.01); *G06F 12/0895* (2013.01); *G06F 12/1009* (2013.01)

(58) Field of Classification Search
CPC ..... G06F 3/065; G06F 3/0604; G06F 3/0683; G06F 12/0207; G06F 12/0292; G06F 12/0886; G06F 12/0895; G06F 12/1009
USPC .......... 711/162, 205, 206, 209, 210; 707/693, 707/698, 999.101; 710/26, 65, 68; 712/26, 712/35, 210, 300
See application file for complete search history.

(56) References Cited

U.S. PATENT DOCUMENTS

2006/0067346 A1* 3/2006 Tucker ................ G06F 12/1081 370/412
2014/0104084 A1* 4/2014 Cohen ................. H03M 7/3084 341/87

OTHER PUBLICATIONS lz4—Extremely Fast Compression algorithm, 2 pg., Feb. 2012. https://code.google.com/p/lz4/source/browse/trunk/lz4_format_description.txt.
lz4—Extremely Fast Compression algorithm, 2 pg., Feb. 2014. https://code.google.com/p/lz4/source/browse/trunk/cmake_unofficial/CMakeLists.txt.
Snappy—A fast compressor/decompressor; 2 pg., Oct. 2011. https://code.google.com/p/snappy/source/browse/trunk/format_description.txt.

* cited by examiner

*Primary Examiner* — Reba I Elmore
(74) *Attorney, Agent, or Firm* — Birch, Stewart, Kolasch & Birch, LLP

(57) ABSTRACT

A processor-implemented method of decoding computer-readable data from a tag-based data format having a big tag size and a small tag size is provided. Decoding includes: reading the next tag in the received input, the tag including information about a tag size, a literal length, a literal, a copy length, and a copy offset; processing the read tag to determine whether the tag size; and reading the information about the literal length, copy length, and copy offset from the tag based on the determined tag size. Decoding includes processing the literal by writing information representing the literal to output representing the decoded computer-readable data. Decoding also includes processing copy data included in the tag based on the copy length and the copy offset. A data read point for the input and a data write point for the output may be advanced appropriately during or after literal and copy processing.

22 Claims, 9 Drawing Sheets

COMPRESSION FORMAT DESIGNED FOR A VERY FAST DECOMPRESSOR

BACKGROUND

Today increasingly, data is transmitted, stored, and/or processed in compressed formats. In some cases, compression allows a reduction of I/O (input/output) operations. However, for this to translate into improved computation speed, the compression and decompression need to be fast. In particular, fast decompression is important in scenarios such as ones where data is read from a storage location more often than it is written.

SUMMARY

Some embodiments of solutions discussed herein may pertain to a processor-implemented method of decoding computer-readable data from a tag-based data format having a big tag size and a small tag size, the method comprising: receiving, as input, data comprising a plurality of tags, each tag in said plurality being in the tag-based data format and having either a big tag size or a small tag size; reading the next tag in the received input, the tag including information about a tag size, a literal length, a literal, a copy length, and a copy offset; processing the read tag to determine whether the tag has a big tag size or a small tag size, said processing the read tag including reading the information about the literal length, copy length, and copy offset from the tag based on the determined tag size; processing the literal associated with the tag based on the read information about the literal length, said processing including writing information representing the literal to output representing the decoded computer-readable data, said writing being performed at an end of the output; processing copy data included in the tag based on the copy length and the copy offset after said processing literal data, said processing including establishing a copy read point in the output based on the copy offset and the end of the output; and copying information from the copy read point to the end of the output based on the copy length; advancing the data read point based on the determined tag size; and performing the step of determining whether a data read point has passed an end of the received input after said advancing.

In some embodiments, the step of determining whether the data read point has passed an end of the received input includes: determining whether a data read point has passed an end of the received input; in response to a determination that the data read point has passed an end of the received input, indicating the decoding as completed; and in response to a determination that the data read point has not yet passed the end of the received input, reading the next tag in the received input.

In some embodiments, reading the next tag includes reading an amount of data associated with the big tag size. In some embodiments, the big tag size is a first number of bits and the small tag size is a second number of bits. In some embodiments, reading the next tag includes reading a first number of bits of the input starting at the data read point.

In some embodiments, processing the read tag includes determining a tag size by checking a predetermined read bit of the read tag to determine whether the predetermined read bit indicates that the read tag has the big tag size or the small tag size.

In some embodiments, the predetermined read bit is the first read bit. In some embodiments, reading the information about the literal length, copy length, and copy offset includes: in response to the first read bit indicating a small tag size, reading the second through fourth bits as the literal length, reading the fifth through eighth bits as the copy length, reading the eighth through twenty-fourth bits as the copy offset, and ignoring the remaining read bits of input; in response to the first read bit indicating a big tag size, reading the second through seventh bits as the literal length, reading the eighth through sixteenth bits as the copy length, and reading the seventeenth through thirty second bits as the copy offset.

In some embodiments, advancing the data read point includes advancing the data read point by the first number of bits when the first read bit indicates a big tag size; and advancing the data read point by the second number of bits when the first read bit indicates a small tag size.

In some embodiments, the first number of bits is 32 bits and the second number of bits is 24 bits.

In some embodiments, processing the literal includes first determining whether the literal is less than or equal to a first threshold length, there are at least a number of bytes equal to the first threshold length in the received input from the data read point, and there is space available in the output for at least a number of bytes equal to the first threshold length; in response to satisfying all the conditions of said first determining, writing a number of bytes represented by the first threshold length to the end of the output from the input starting at the data read point; advancing the data read point by the literal length; and setting the end of the output to be equal to the previous end of the output plus the literal length.

In some embodiments, the method further includes: in response to not satisfying all the conditions of said first determining, second determining whether the literal length is equal to a predetermined indicator value; in response to said second determining indicating that the literal length is equal to the predetermined indicator value, reading a third number of bits from the input as the literal and advancing the data read point by the third number of bits; third determining, after said second determining, whether there are at least a number of bytes represented by the literal length remaining in the received input from the data read point, and there is space available in the output for at least a number of bytes represented by the literal length; in response to satisfying all the conditions of said third determining, writing a number of bytes represented by the literal length to the end of the output from the input starting at the data read point.

In some embodiments, establishing a copy read point in the output includes: determining whether the copy read point is set to a location that is before a start of the output; and in response to a determination that the copy read point is set to a location that is before the start of the output, indicating that an error has occurred during the decoding.

In some embodiments, processing copy data includes: fourth determining whether the copy length is less than or equal to a second threshold length, the copy offset is at least a third threshold length, and there is space available in the output for at least a number of bytes equal to the second threshold length.

In some embodiments, copying information from the copy read point includes, in response to satisfying the conditions of said fourth determining, copying a number of bytes equal to the second threshold length to the end of the output from the copy read point; and setting the end of the output to be equal to the previous end of the output plus the copy length.

In some embodiments, processing copy data includes: in response to not satisfying all the conditions of said fourth determining, fifth determining whether there is space available in the output for a number of bytes represented by the copy length plus a copy buffer amount; in response to a determination that there is not enough space available for a number of bytes represented by the copy length plus a copy buffer amount, determining whether there is space available in the output for a number of bytes represented by the copy length; and in response to a determination that there is space available in the output for a number of bytes represented by the copy length, copying a number of bytes equal to the copy length to the end of the output from the copy read point.

In some embodiments, the method further includes: in response to a determination that there is enough space available for a number of bytes represented by the copy length plus a copy buffer amount, sixth determining whether the copy offset is at least half the maximum permitted copy offset size; in response to a determination that the copy offset is at least half the maximum permitted copy offset size, copying a number of bytes equal to the copy length to the end of the output from the copy read point.

In some embodiments, the method further includes: in response to a determination that the copy offset is not at least half the maximum permitted copy offset size, copying a number of bytes equal to half the maximum permitted literal size to the end of the output from the copy read point; reducing the copy length by the copy offset; doubling the copy offset after said copying a number of bytes; and performing said sixth determining after performing said reducing the copy length.

In some embodiments, establishing a copy read point in the output includes setting the copy read point to a value based on a difference between the end of the output and the copy offset.

In some embodiments, the method further includes: in response to a determination that there is not enough space available in the output for a number of bytes represented by the copy length, indicating that an error has occurred during the decoding.

In some embodiments, the first threshold length is 16 bytes. In some embodiments, the third threshold length is 8 bytes. In some embodiments, the big tag size is a first number of bits and the small tag size is a second number of bits; and said reading the next tag includes reading a first number of bits of the input starting at the data read point. In some embodiments, advancing the data read point includes advancing the data read point based on the determined tag size and the literal length. In some embodiments, the second threshold length is 16 bytes.

Some embodiments of solutions, techniques, and systems described herein may include one or more of a non-transitory computer-readable storage medium or a system including a processor and a processor-readable storage medium, the storage medium having embodied thereon instructions for performing one or more of the methods or method steps described above and variations thereon.

Embodiments of some or all of the processor and memory systems disclosed herein may also be configured to perform some or all of the method embodiments disclosed above. Embodiments of some or all of the methods disclosed above may also be represented as instructions embodied on transitory or non-transitory processor-readable storage media such as optical or magnetic memory or represented as a propagated signal provided to a processor or data processing device via a communication network such as an Internet or telephone connection.

Further scope of applicability of the systems and methods discussed will become apparent from the detailed description given hereinafter. However, it should be understood that the detailed description and specific examples, while indicating embodiments of the systems and methods, are given by way of illustration only, since various changes and modifications within the spirit and scope of the concepts disclosed herein will become apparent to those skilled in the art from this detailed description.

BRIEF DESCRIPTION OF THE DRAWINGS

The systems and methods discussed will become more fully understood from the detailed description given herein and the accompanying drawings that are given by way of illustration only and thus are not limitative.

The drawings will be described in detail in the course of the detailed description.

DETAILED DESCRIPTION

The following detailed description refers to the accompanying drawings. The same reference numbers in different drawings identify the same or similar elements. Also, the following detailed description does not limit the concepts discussed. Instead, the scope of the concepts discussed herein is defined by the appended claims and equivalents thereof.

Different operations within a computer, computing device, computing system, or other processor-equipped data processing device may have different levels of speed and efficiency associated therewith. Making the most effective and efficient use of computing resource and computing operations may allow for a computer or data processing device to realize better performance using existing hardware. In particular, a reduction in the number or frequency of input/output (I/O) operations may be a source of significant performance improvement through the use of effective data compression techniques.

Figure 1A:
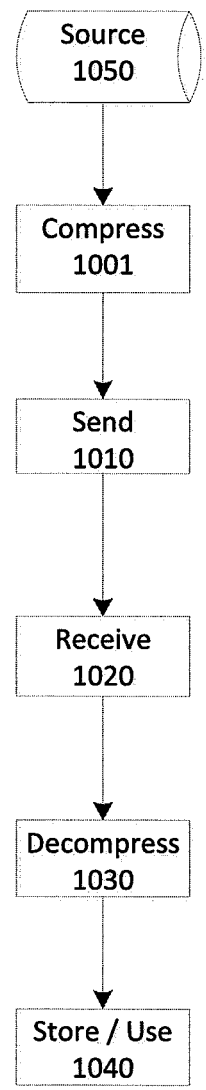
FIG. 1a shows an embodiment of a data compression and de-compression process as described herein.

An example of compressed data output and input is shown in FIG. 1a. In the example shown, data from a data source 1050 may be compressed 1001 with a data compression module in a computer or data processing system. Such compressed data may then be sent 1010 to another computer system or another module within the system, which may be configured to receive 1020 and decompress 1030 the data for subsequent processing, storage, or other use 1040.

Transmitting compressed data may reduce the amount of data being sent and/or received, thereby increasing overall system speed. However, processing of this data may erode any such gains or efficiencies if the compression and/or decompression operations for the data are not sufficiently fast. Fast decompression is especially useful in realizing processing speed improvements.

A reduction in a number of processing steps required for data decompression may also lead to significant performance improvements at least in part because of the branch prediction architectures employed by most processors. An incorrect branch prediction may entail many wasted processor cycles. Reducing the number of branch mis-predictions incurred (or, in some cases, the number of branch predictions required at all) for each decoded block of information can translate into significant gains in processing speed.

In some embodiments, reducing the number of branch mis-predictions in a processor will inherently improve data decompression speed because more processor cycles are being spent on actual data decompression instead. In some embodiments, such a reduction in branch mis-predictions may be realized with a loss-less data compression format conducive to more computationally efficient decompression processing. An embodiment of such data format is depicted in FIG. 1*b*.

In the embodiment shown, data may be compressed into a series of blocks 1300. Each block 1300 may include a tag 1310, a literal 1340, and a copy 1350. The literal 1340 may include a literal length 1320 and a literal content 1330. The literal content 1330 is a representation of the source data that has been compressed. The copy 1350 includes a copy offset 1360 and a copy length 1370. The copy 1350 represents part of the compressed aspect of the source data.

During decompression, the literal content 1330 and the copy 1350 are used together to generate output that represents the original data. In a loss-less embodiment, the decompressed output will preferably be an exact duplicate of the original data. In particular, during decompression, the copy offset 1360 and length 1370 identify what information from the generated output so far is to be repeated or otherwise copied to the ongoing output during decompression to recover the original data.

Figures 1B, 1D:
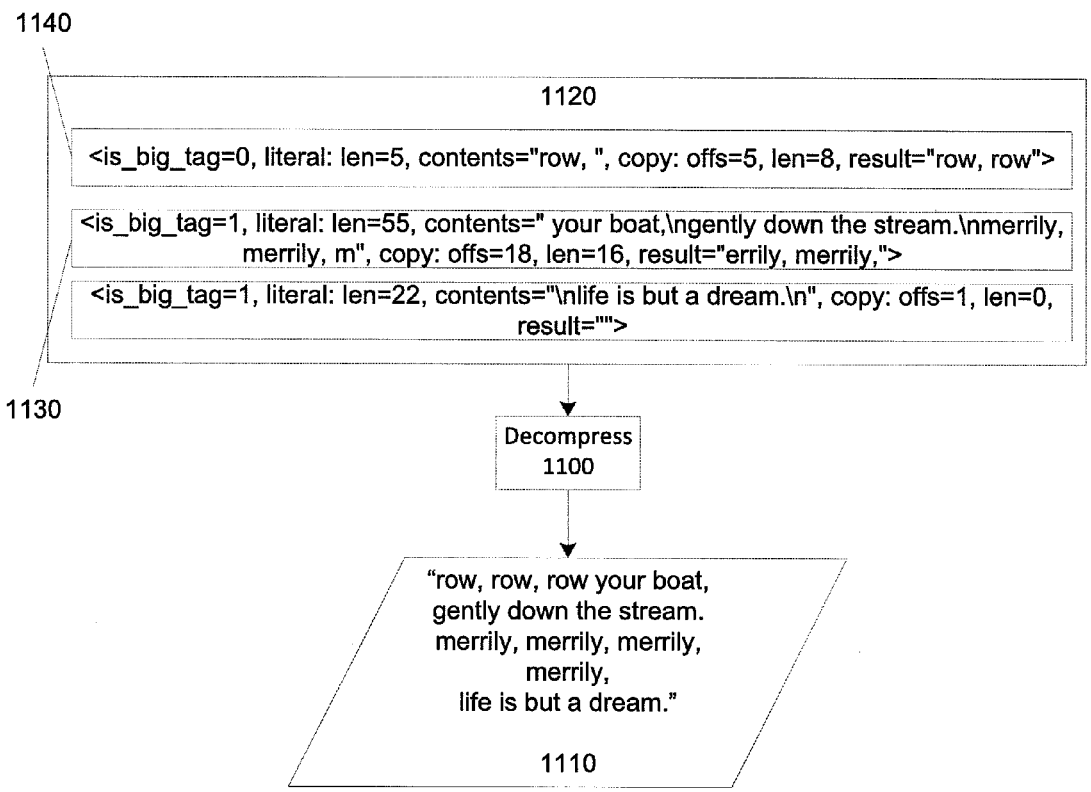
FIG. 1b shows a block diagram of an embodiment of a compressed data format as described herein.
FIG. 1d shows an example of compressed data in an embodiment of a compressed data format as described herein.

As can be seen from the embodiment shown in FIG. 1*b*, the data compression format depicted is a format consisting of tags, where all tags include exactly one literal 1340 and one copy 1350. The literal 1340 may be associated with a length 1320 that represents a number or bits (or bytes) included in the content 1330 of the literal 1340. The literal length 1320 can be zero. In cases where there is significant repetition in a set of data, the literal length 1320 may frequently be zero, with all the data compressed in the tag 1310 being represented in the copy 1350. The copy length 1370 may also be zero in some cases.

In some embodiments, the tags may be variable-sized. For, example, in the embodiment shown in FIG. 1*b*, there may be "small" tags and "big" tags. In some embodiments, the "small" tags are 24 bits long and "big" tags are 32 bits. One of the bits (the tag bit 1310) may specify whether the tag is small or big. In some embodiments, small tags may have 3 bits used to specify literal length 1320 and 4 to specify bits copy length 1370. In some embodiments, big tags may have 7 bits to specify literal length 1320 and 8 bits to specify copy length 1370.

In some embodiments, the copy offset 1360 is always a 16 bit value. However, in some embodiments, the copy offset length may be different between small tags and big tags. In some embodiments, the tag and/or the copy offset may be a fractional number of bytes, such as, for example, 10 or 12 bits. In some embodiments, at least one tag in such a compressed string may include a copy offset 1130. The copy offset indicates a location in the already-output data stream from which data is to be copied and added to the output data stream. In some embodiments, the copy length may include to-be-copied output data. A tag with a short literal 1140 may, for example, have that literal string copied in its entirety and then at least partially copied again.

In some embodiments, a copy offset of 0 may be expressly prohibited. In some embodiments, a copy offset of 0 may be avoided altogether by an encoding scheme that always adds 1 to the copy offset length read from the tag. Such a scheme may save time checking for 0 in an embodiment of a decompressor.

In some such embodiments, compressing the string "first a literal of 4 bytes and then a copy of 15 bytes," could be realized using only "small" tags, and such an approach would save 8 bits over a "big" tag. However, if either the literal or the copy grows out of bound, a big tag would be required.

Efficiencies in decompression can be realized in embodiments having fixed or known tag sizes. In the embodiment described above, where small tags are 24 bits and big tags are 32 bits, it is immediately apparent that any tag will fit within 32 bits no matter what. Because of this, it is possible to do a 32 bit read from memory at the start of a tag without having to know the tag size. It only becomes necessary to look at the tag bit, and index into some small arrays to get the right shifts and masks to decode the tag. This makes for branch-reduced or, in some cases, branch-free decompression.

In some embodiments, the tag big 1310 may be placed in the bottommost bit. Such embodiments may allow for further improvements in decompression or decoding speed in conjunction with little-endian CPUs (Central Processing Unit). In some embodiments not meant for a little-endian CPU, the tag bit 1310 or other tag marker may be handled differently.

An example of a data compressed/encoded into an embodiment of a tag-based data format using a big tag size and a small tag size is depicted in FIG. 1*d*. In the embodiment shown, an input data stream or block 1500 may be operated on or fed to a compressor 1510 or encoder realized either as a specialized processor or a CPU equipped with specialized instructions. The output 1520 of the compressor 1510 may be represented as a block or stream or sequence of tags, each tag representing a particular portion of the input data 1500 either in the form of literal data, copy information, or a combination thereof.

Figure 1C:
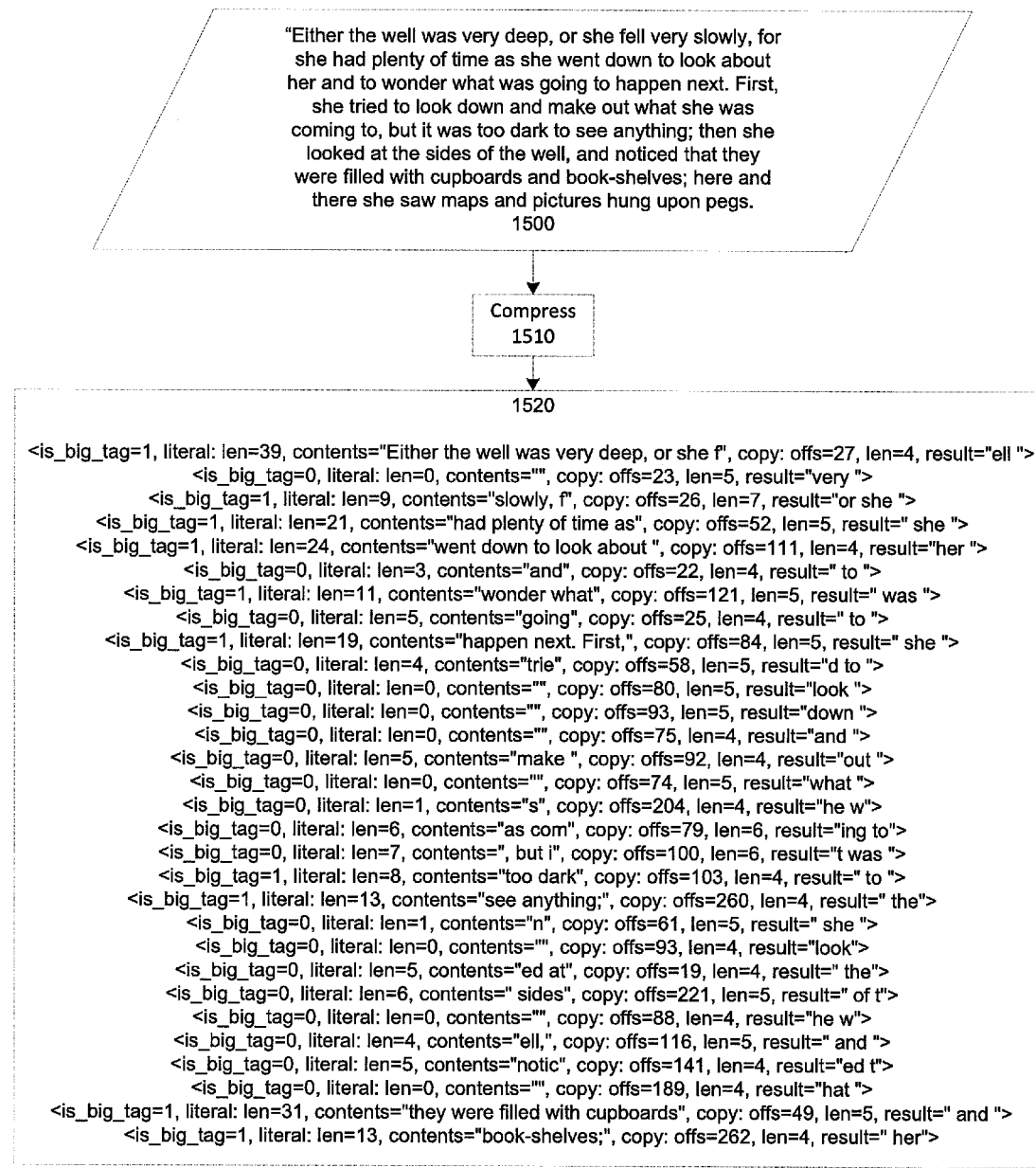
FIG. 1c shows an example of compressed data in an embodiment of a compressed data format as described herein.

An example of data recovered from information represented in an embodiment of a tag-based data format using a big tag size and a small tag size is depicted in FIG. 1*c*. In the embodiment shown, input data 1120 may be a block or stream of tags, each tag being either a big tag or a small tag and each tag including literal data, copy information, or a combination thereof. In some embodiments, a tag may include only copy information and no literal data.

The input data 1120 may be operated on or otherwise fed to a decompressor 1100 or decoder realized either as a specialized processor or a CPU equipped with specialized instructions. The output 1100 of the decompressor 1100 may be represented as a block or stream or sequence of output data that, in a loss-less encoding/compression scheme, should be a duplicate of the original data encoded into the tag-based input 1120.

Figure 2A:
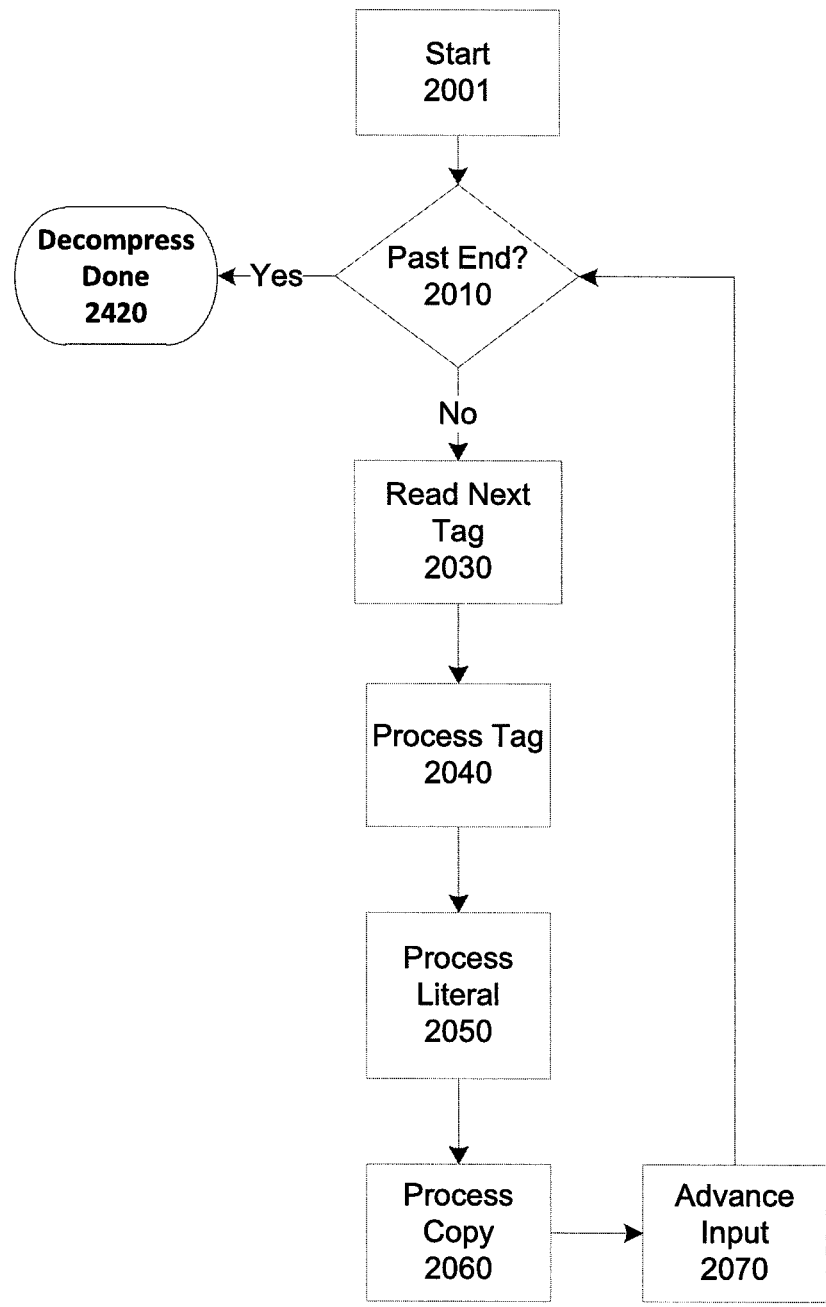
FIG. 2a shows an embodiment of a data decompression process as described herein.

An embodiment of a decompression process for a tag-based data format using a big tag size and a small tag size is depicted in FIG. 2*a*. In the embodiment shown, a decoding or decompression operation may start 2001 with a first tag in a stream or set or block of data compressed into a series or group of big and small tags as described above.

Decompression may start 2001 at the first bit of the first tag. Once the process is determined to have reached or gone past the last bit of the last tag, or otherwise past the end 2010 of the stream or set or block of compressed data, decompression may be determined to be completed 2420, with the decompressed data being a stream or set or block of output.

The data decoding or decompression process may proceed by reading the next available tag 2030 in the data set. In embodiments having big tags of a first size (e.g. 32 bits) and small tags of a different size (e.g. 24 bits), reading the next available tag 2030 may include reading a number of bits associated with a big tag (e.g. 32 bits) instead of first checking to see the size of the tag. In such an embodiment, the read data will always include the entirety of a tag regardless of whether it is a large tag or a small tag. In some embodiments, a check may be performed as part of the read 2030 operation to ensure that the read does not go past the end of the input buffer. In some embodiments, such a check may be an express check that changes to a different reading mode when fewer than 24 bits are available for input. In some embodiments, such a check may be avoided through the use of one or more padding bytes at the end of the input data.

The read tag may then be processed 2040 to determine if it is a large tag or a small tag, with appropriate shifts and masks being set based on the determined tag size. The lowest bit in the tag may be picked out, for example, performing an AND operation. A lowest tag bit value of "1" may, for example, indicate a big tag and a result of "0" may, for example, indicate a small tag. In some embodiments, the lowest bit in the tag is used to indicate tag size because of processing efficiencies that can be realized in, for example, little-endian processors. An AND operation may be preferred in this case for reasons of speed and efficiency.

The decoding or decompression then proceeds with processing the literal 2050 and the copy 2060 before advancing to the next appropriate location in the data input 2070 and also advancing the output (not shown) as needed. In some embodiments, the input may be advanced 2070 based on the tag size such that the input may be advanced in one of two fixed increments (e.g. 24 bits or 32 bits).

In some embodiments, the literal may be processed 2050 by first establishing the literal length and then reading out the appropriate number of bits. The copy may then be processed 2060 by establishing the appropriate copy length and copy offset amounts and then copying the appropriate portion(s) of the already-decoded/decompressed data to the end of the output stream or block.

In some embodiments, advancing the input 2070 may be realized based on a result of the operation that determines the tag size. In an embodiment using 32 or 24 bit tags, the input may be advanced 2070 by a number of bytes equal to 3+the result of the AND operation. In such an embodiment, a big tag will always cause a 32 bit advance (result of "1") and a small tag will always cause a 24 bit advance (result of "0"). The embodiment shown is also branch-free, meaning that there is no possibility for branch misprediction in the processor. In some cases, each mis-predicted branch may waste five or more processor cycles. Eliminating the possibility for mispredictions may therefore improve performance by improving operating efficiency of the processor.

Although depicted above as a sequential decompression or decoding operation, some embodiments may decompress or decode multiple tags in parallel. In such embodiments, instead of storing tag and literal data sequentially, multiple tags may be stored separately from multiple literals in a data stream. Such a data format may require an appropriate compression or encoding technique to create the desired data format.

Figure 2B:
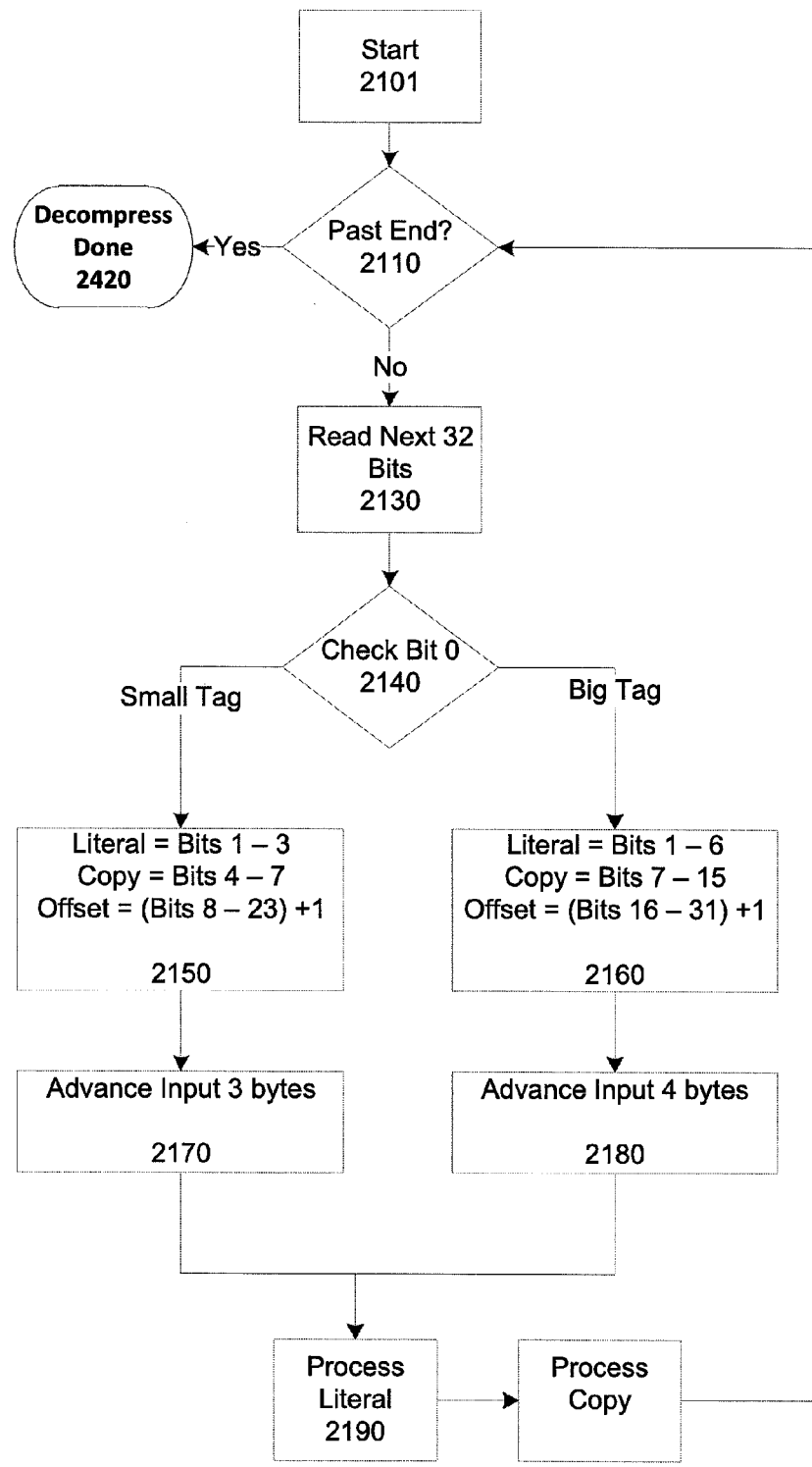
FIG. 2b shows an embodiment of a data decompression process as described herein.

An embodiment of a decompression process for a tag-based data format using a big tag size of 32 bits and a small tag size of 24 bits is depicted in FIG. 2b. In the embodiment shown, a decoding or decompression operation may start 2001 with a first tag or a first bit in a stream or set or block of input data compressed into a series or group of big and small tags as described above. If there is no indication that the read point is at, or the read operation will go past, the end of the input 2110, the next 32 bits (big tag size) are read 2130.

In the embodiment shown, the process may be configured especially for a little-endian CPU. In such a process, the $0^{th}$ bit of the read bits 2130 may be checked 2140 to determine if the read tag is a big tag or a small tag. In the case of a big tag, the masks and shift are set 2160 so that literal length is defined in bits 1-6 2160. The copy length is defined in bits 7-15 with the copy offset being defined in bits 16-31 2160. In the embodiment shown, 1 is added to the copy offset length 2160 to ensure that the copy offset length will never be zero. In the case of a small tag, the masks and shifts are set 2150 for a 3-bit literal length, a 4-bit copy length, and a 16 bit copy offset 2150. Bits 24-31 may be ignored in the case of a small tag because they are not part of the tag.

After the masks and shifts are set, the input may be advanced by 3 bytes 2170 in the case of a small tag or by 4 bytes 2180 in the case of a big tag. The read bits 2130 may then be processed to extract the literal 2190 and copy the appropriate portions of the existing output before advancing the output and checking if the input has advanced past the end 2110. If the input has advanced past the end 2110, decompression is determined to be completed 2420 or an error may be indicated (not shown). For example, a tag indicating a 100-byte literal when only 50 bytes remain may trigger an error. Otherwise, the next tag in the input data stream/sequence/block is read 2130 and processed.

Figure 2C:
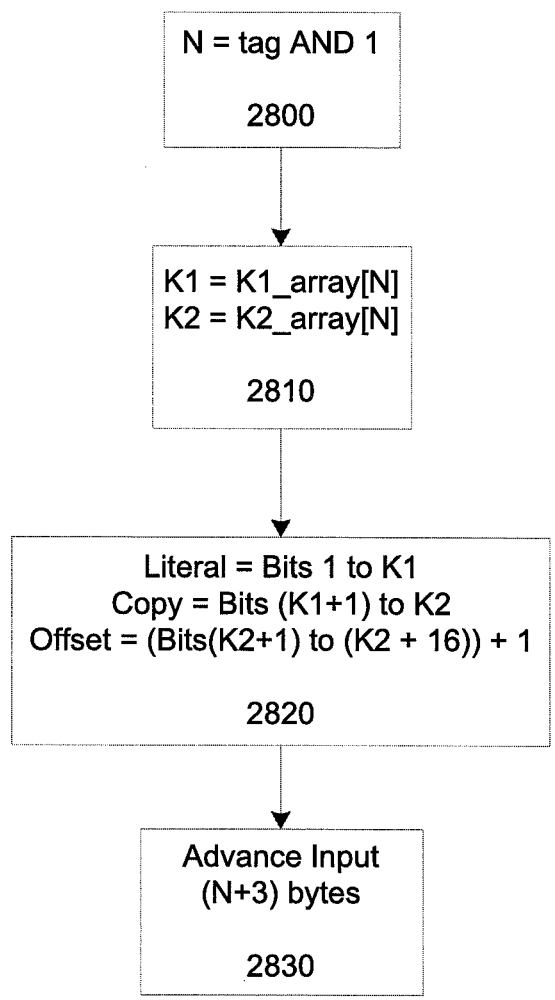
FIG. 2c shows an embodiment of a data decompression process as described herein.

Although depicted in FIG. 2b with a decision, or branch, in the decompression logic, the tag processing performed after reading a block of input data may be realized as a branch-free implementation such as the one shown in FIG. 2c.

In the embodiment shown, a tag is determined to be a large or a small tag by performing and AND operation with the tag bit 2800. The result of the AND operation is stored in a variable for subsequent use, thereby avoiding the need for a branching decision path. The literal length and copy length/offset value bit lengths are then determined on the AND operation result 2810. The appropriate bits are then extracted to determine the literal length, copy length, and copy offset values 2820 before advancing the input 2830 based on the tag size. In some embodiments, steps 2810 and 2820 may be realized in or replaced by one or more shift and mask operations. As can be seen, this embodiment has no branches, therefore eliminating the possibility of branch misprediction and allowing for improved computational efficiency during decoding.

Figure 2D:
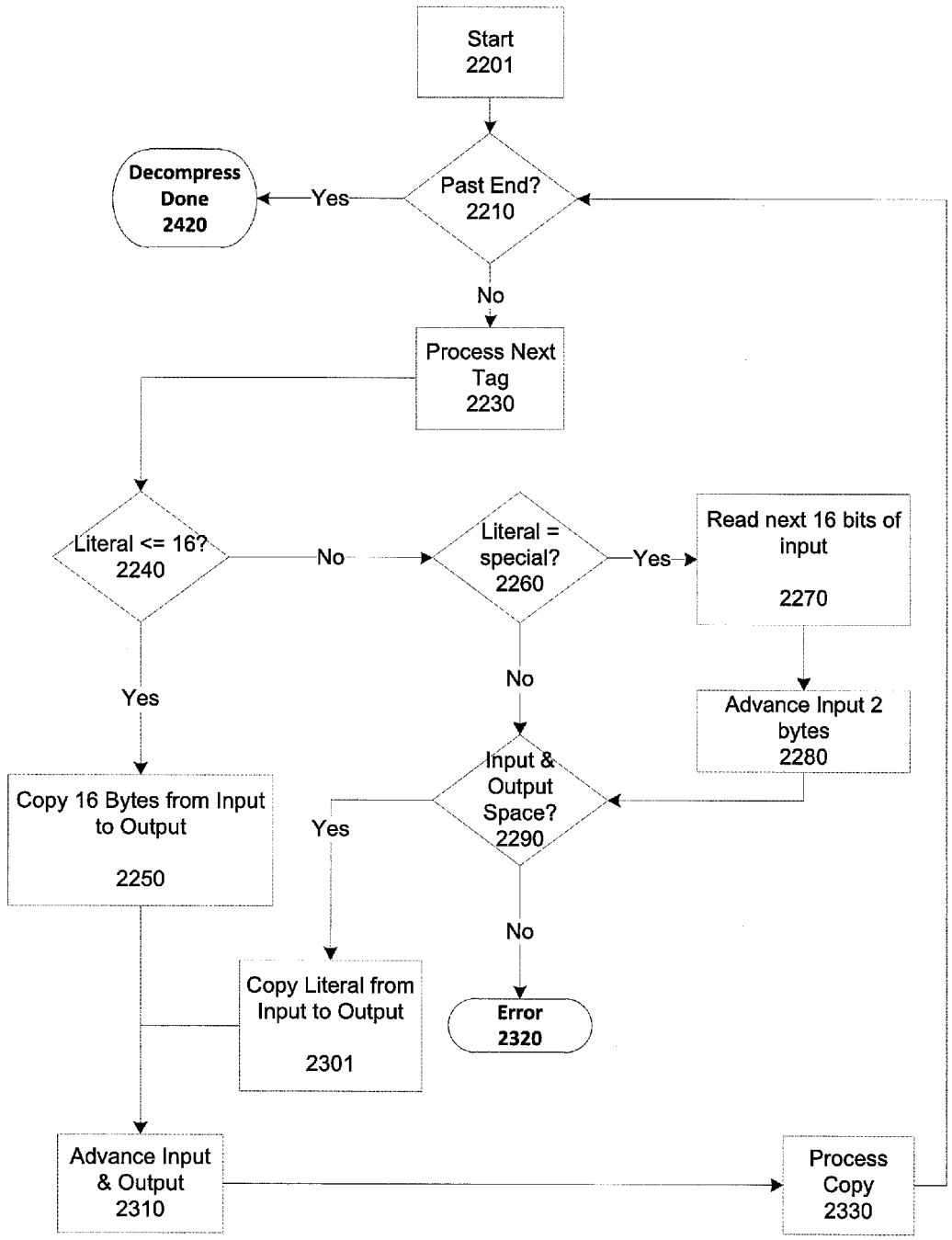
FIG. 2d shows an embodiment of a data decompression process as described herein

An embodiment of a decompression process for a tag-based data format using a big tag size of 32 bits and a small tag size of 24 bits is depicted in FIG. 2d. In the embodiment shown, a decoding or decompression operation may start 2201 with a first tag or a first bit in a stream or set or block of input data compressed into a series or group of big and small tags as described above. If there is no indication that the read point is at, or the read operation will go past, the end of the input 2210, the next tag is read and processed 2230. After it is determined whether the read tag 2230 is a big tag or a small tag, and the masks and shifts are set accordingly (not shown), a check may be performed to determine if the literal length is less than or equal to a certain threshold amount 2240.

In some embodiments, this check 2240 may include determining if the literal is less than or equal to 16 bytes. In some embodiments, such a check 2240 may also include a determination of whether there are at least 16 bytes (128 bits) of available input and whether there is space for at least 16 bytes of output. In some embodiments, if the answer to such a check is in the affirmative, then 16 bytes may be copied from the input to the output. The output and input may then be advanced by the literal length 2310. Such an embodiment allows for easily predictable branches. For example, in practical benchmarking, it has been determined that a scenario where there are 16 bytes free in both the inputs and the output is true in over 99% of all cases. This means that branch mispredictions will occur in less than 1% of decompression operations.

In the embodiment described above, a 16 byte copy is performed for any literal length that is 16 bytes or less. This ensures that the entire literal is copied with a minimum of CPU operations. Since the copy amount is fixed, there is no need for a prediction or other guess as to the amount to be copied, and since the amount is always 16 bytes, any literal of 16 bytes or less is fully copied. The output and input are then advanced 2310 by the literal length, which may be less than 16 bytes. In embodiments where the literal length is less than 16 bytes, some input bits may be re-read and some output bits may be overwritten. However, since these bits are not otherwise processed during the copy operation, the total number of operations performed by the processor during decoding/decompression are reduced. Furthermore, the check for a literal of at least 16 bytes described above is, in some embodiments, highly predictable. In some embodiments, most literals may be short. In some embodiments where literals are long, there may be few literals and many copies, meaning that decompression will still be fast.

In the embodiment shown, if the literal is larger than 16 bytes or there is insufficient remaining input or insufficient output space 2240, a second check is performed to see if the literal is at a special value indicating a very long literal 2260. In the embodiment shown, the special value be 63 (indicating that the true literal length is stored after the tag). If the literal is not set at the special value, a further check may be performed to determine whether the available input and the space available in the output are both at least equal to the literal length 2290. If there is either insufficient input or insufficient output space 2290, an error occurs 2320 and the operation may be halted or passed over to an error or exception handling routine. Otherwise a number of bytes corresponding to the literal length are copied from the input to the output 2301 and the input and output are advanced based on the literal length 2310.

In the embodiment shown, if the literal is at the special value indicating that the true literal length is stored after the tag, the next 2 bytes after the tag are read 2270 and the input is advanced by 2 bytes 2280. Then the further check to determine whether the available input and the space available in the output are both at least equal to the literal length is performed 2290. If there is sufficient input and output space 2290, the information is copied 2301 from the input to the output and the input and output are advanced accordingly 2301. Otherwise, an error may have occurred 2320 and the decoding/decompression operation may be halted or passed over to an error or exception handling routine (not shown).

After the input and output are advanced 2310 based on the copied literal, the copy portion of the tag may be processed 2330 before performing a check to see whether the process has gone past the end of the input 2210. If the end of the input has been passed 2210, decompression/decoding is determined to have completed 2420. Otherwise, the next tag is processed 2230.

Figure 2E:
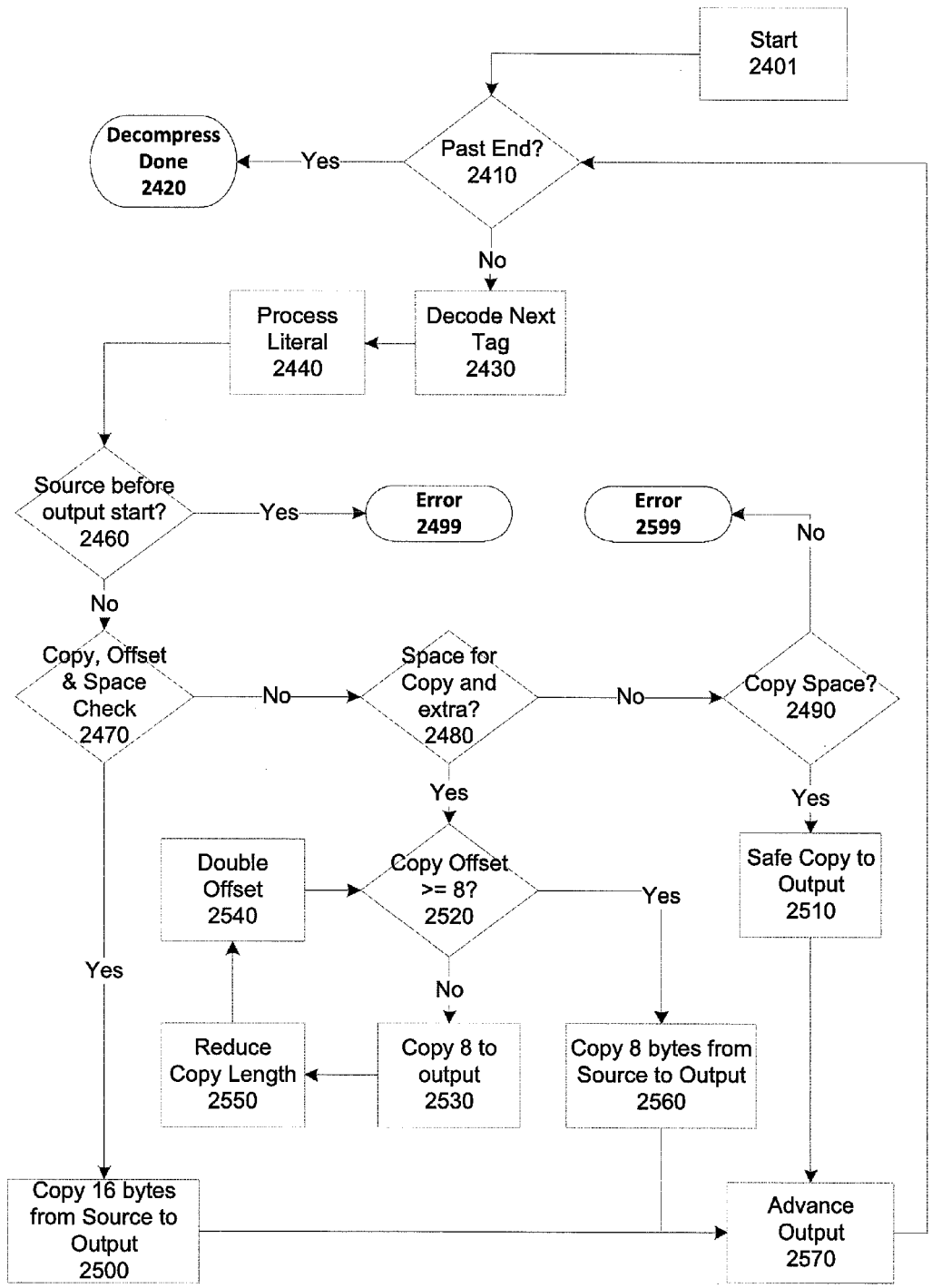
FIG. 2e shows an embodiment of a data decompression process as described herein.

An embodiment of a decompression process for a tag-based data format using a big tag size of 32 bits and a small tag size of 24 bits is depicted in FIG. 2e. In the embodiment shown, a decoding or decompression operation may start 2401 with a first tag or a first bit in a stream or set or block of input data compressed into a series or group of big and small tags as described above. If there is no indication that the read point is at, or the read operation will go past, the end of the input 2410, the next tag is read and processed 2430. After it is determined whether the read tag 2230 is a big tag or a small tag, and the masks and shifts set accordingly (not shown), the literal associated with the tag may be processed 2440. After the literal is processed and any literal information is written to the output (not shown), the copy portion of the tag may be processed.

The copy processing may begin by setting the copy source location in the output stream to be equal to a difference between a location value of the copy pointer and the copy offset. In such an embodiment, a check is preferably performed to ensure that adjusting the copy pointer in this way does not set the copy source location to be before the output start 2460. If the copy source location is set to a data location that is before or otherwise beyond the output start 2460, this is indicative of an error 2499 and the decoding/decompression operation may be halted or passed over to an error or exception handling routine (not shown).

If the copy source location is not set to a data location that is before or otherwise beyond the output start 2460, a subsequent check may be performed to ensure that there is sufficient space for the copy in the output 2470. In the embodiment shown, this check may include determining whether the copy length is 16 bytes or less, whether the copy offset is at least 8 bytes, and whether there is enough space for at least 16 bytes in the output. If all these conditions are met 2470, then 16 bytes are copied from the copy source to the output 2500.

In some embodiments, the copy 2500 may be performed in 8-byte increments. Copying in 8-byte increments may be preferable in some embodiments operating on 64-bit processors. In some embodiments, copying in 16-byte increments may produce further improvements in decompressor speed or efficiency. Although some embodiments may copy too much, the extra copy bits may be ignored and overwritten later after the output is advanced by the copy length 2570, meaning any extra copied bits are treated as though they are not part of the output.

In some embodiments, if all the conditions of the check 2470 are not met, a further check may be performed 2480 to determine whether there is sufficient space in the output for at least the copy length an extra amount of bytes. In some embodiments, the extra amount may be ten bytes. If the conditions of this further check 2480 are not met, a final check may be performed 2490 to determine whether there is sufficient space in the output for at least as many bytes as are specified in the copy length. If the conditions for this final check 2490 are not met, this is indicative of an error 2599 and the decoding/decompression operation may be halted or passed over to an error or exception handling routine (not shown).

In some embodiments, if the conditions of the further check 2480 are not met, but the conditions of the final check 2490 are met, a number of bytes specified by the copy length may be copied from the copy source to the output 2510. In some embodiments, such copying may be performed one byte at a time. Copying one byte at a time may be important in cases where the copy offset may be less than 2.

In some embodiments, if the conditions of the further check 2480 are met, the copy offset is evaluated 2520 to determine whether it is at least 8. If the copy offset is less than 8, 8 bytes are copied from the copy source to the output 2530. Then, the copy offset is doubled 2540 and the copy length is reduced 2550 by the copy offset. After this doubling of the offset 2540 and reduction of the copy length 2550, the copy offset is checked again 2520 to see if it is at least 8. If not, another 8 bytes are copied to the output 2530.

In some embodiments, if the copy offset is at least 8 2520, a number of bytes corresponding to the copy length may be copied from the copy source to the output in 8-byte increments. In some embodiments, this may be a similar type of copy operation to that defined by step 2500.

In some embodiments, after the copy is processed for a particular tag, the output may be advanced 2570 by an amount according to the copy length. After the output is advanced for the copy length 2570, a check may be performed to see whether the process has gone past the end of the input 2410. If the end of the input has been passed 2410, decompression/decoding is determined to have completed 2420. Otherwise, the next tag is decoded 2430.

Figure 3:
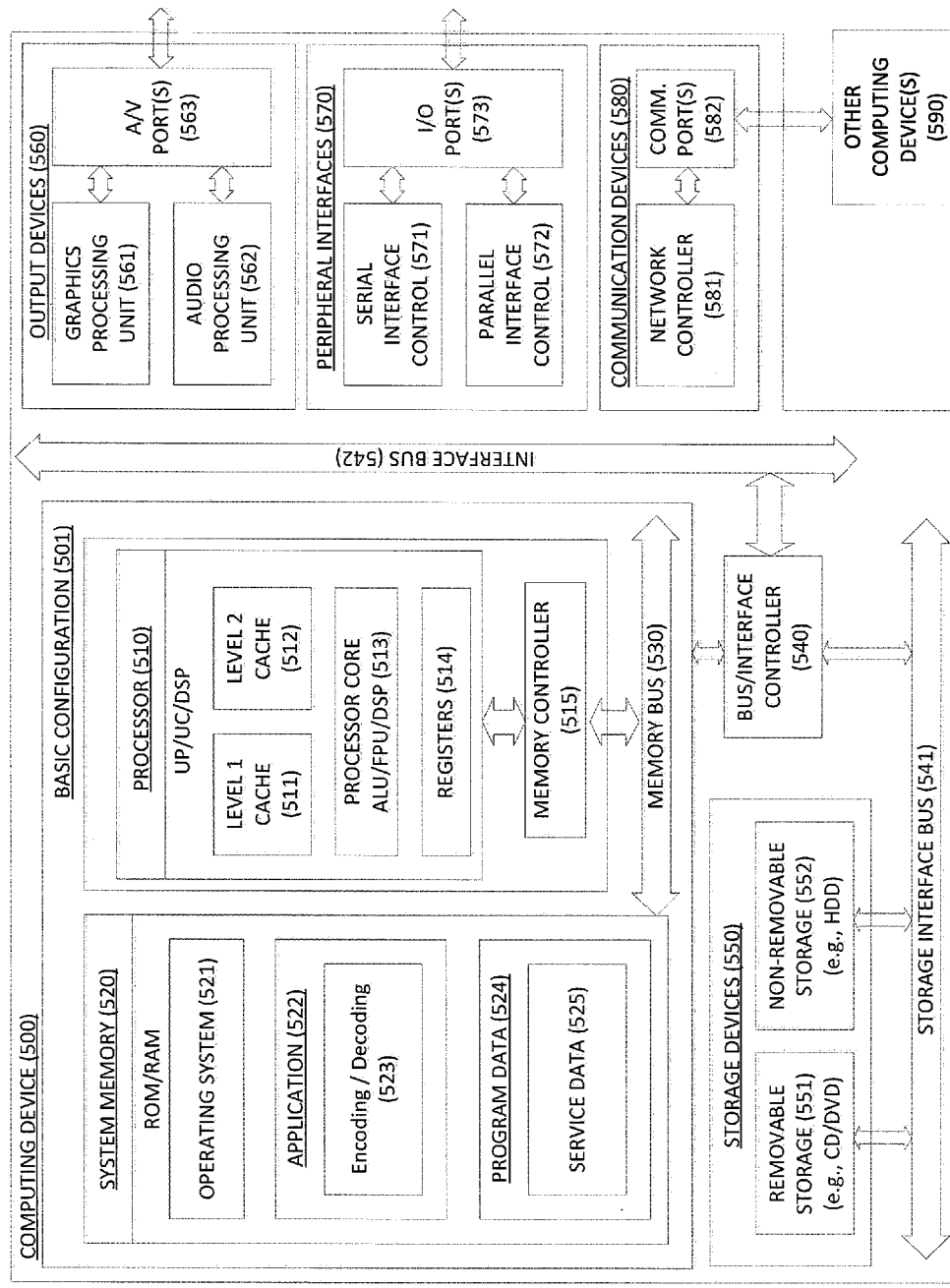
FIG. 3 shows an embodiment of a computer system configured to perform embodiments of a data compression or data decompression process as described herein.

Although discussed from a functional standpoint, a data encoding/compression and/or decoding/decompression application, feature, or capability may be realized, at least partially, through specifically configured computing devices. FIG. 3 is a block diagram illustrating an example computing device 500 that is arranged to perform . . . techniques as described herein. In a very basic configuration 501, computing device 500 typically includes one or more processors 510 and system memory 520. A memory bus 530 can be used for communicating between the processor 510 and the system memory 520.

Depending on the desired configuration, processor 510 can be of any type including but not limited to a microprocessor (μP), a microcontroller (μC), a digital signal processor (DSP), or any combination thereof. Processor 510 can include one more levels of caching, such as a level one cache 511 and a level two cache 512, a processor core 513, and registers 514. The processor core 513 can include an arithmetic logic unit (ALU), a floating point unit (FPU), a digital signal processing core (DSP Core), or any combination thereof. A memory controller 515 can also be used with the processor 510, or in some implementations the memory controller 515 can be an internal part of the processor 510.

Depending on the desired configuration, the system memory 520 can be of any type including but not limited to volatile memory (such as RAM), non-volatile memory (such as ROM, flash memory, etc.) or any combination thereof. System memory 520 typically includes an operating system 521, one or more applications 522, and program data 524. Application 522 may include data encoding/decoding 523 and/or compression/decompression as discussed herein. Program Data 524 includes service data 525 that are useful for performing the desired operations as described above. In some embodiments, application 522 can be arranged to operate with program data 524 on an operating system 521 such that the overall system performs one or more specific variations of techniques as discussed herein. This described basic configuration is illustrated in FIG. 4 by those components within line 501.

Computing device 500 can have additional features or functionality, and additional interfaces to facilitate communications between the basic configuration 501 and any required devices and interfaces. For example, a bus/interface controller 540 can be used to facilitate communications between the basic configuration 501 and one or more data storage devices 550 via a storage interface bus 541. The data storage devices 550 can be removable storage devices 551, non-removable storage devices 552, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 520, removable storage 551 and non-removable storage 552 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 500. Any such computer storage media can be part of device 500.

Computing device 500 can also include an interface bus 542 for facilitating communication from various interface devices (e.g., output interfaces, peripheral interfaces, and communication interfaces) to the basic configuration 501 via the bus/interface controller 540. Example output devices 560 include a graphics processing unit 561 and an audio processing unit 562, which can be configured to communicate to various external devices such as a display or speakers via one or more A/V ports 563. Example peripheral interfaces 570 include a serial interface controller 571 or a parallel interface controller 572, which can be configured to communicate with external devices such as input devices (e.g., keyboard, mouse, pen, voice input device, camera, touch input device, etc.) or other peripheral devices (e.g., printer, scanner, etc.) via one or more I/O ports 573. An example communication device 580 includes a network controller 581, which can be arranged to facilitate communications with one or more other computing devices 590 over a network communication via one or more communication ports 582.

The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 500 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 500 can also be implemented as a personal computer including both laptop computer and non-laptop computer configurations.

In some cases, little distinction remains between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/ or quantities). A typical data processing system may be implemented utilizing any suitable commercially available components, such as those typically found in data computing/ communication and/or network computing/communication systems.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Only exemplary embodiments of the systems and solutions discussed herein are shown and described in the present disclosure. It is to be understood that the systems and solutions discussed herein are capable of use in various other combinations and environments and are capable of changes or modifications within the scope of the concepts as expressed herein. Some variations may be embodied in combinations of hardware, firmware, and/or software. Some variations may be embodied at least in part on computer-readable storage media such as memory chips, hard drives, flash memory, optical storage media, or as fully or partially compiled programs suitable for transmission to/download by/installation on various hardware devices and/or combinations/collections of hardware devices. Such variations are not to be regarded as departure from the spirit and scope of the systems and solutions discussed herein, and all such modifications as would be obvious to one skilled in the art are intended to be included within the scope of the following claims:

The invention claimed is:

1. A processor-implemented method of decoding computer-readable data from a tag-based data format having a big tag size and a small tag size, the method comprising:
   receiving, as input, data comprising a plurality of tags, each tag in said plurality being in the tag-based data format and having either a big tag size or a small tag size;
   reading a next tag in the received input, the tag including information about a tag size, a literal length, a literal, a copy length, and a copy offset;
   processing, with a processor, the read tag to determine whether the tag has a big tag size or a small tag size, said processing the read tag including reading the information about the literal length, copy length, and copy offset from the tag based on the determined tag size;
   processing, with the processor, the literal associated with the tag based on the read information about the literal length, said processing including writing information representing the literal to output representing the decoded computer-readable data, said writing being performed at an end of the output;
   processing, with the processor, copy data included in the tag based on the copy length and the copy offset after said processing literal data, said processing including establishing a copy read point in the output based on the copy offset and the end of the output; and
   copying information from the copy read point to the end of the output based on the copy length;

advancing the data read point based on the determined tag size; and performing a step of determining whether a data read point has passed an end of the received input after said advancing.

2. The method of claim 1, said reading the next tag including reading an amount of data associated with the big tag size.

3. The method of claim 1, where the big tag size is a first number of bits and the small tag size is a second number of bits; and said reading the next tag includes reading a first number of bits of the input starting at the data read point.

4. The method of claim 3, said processing the read tag including determining a tag size by checking a predetermined read bit of the read tag to determine whether the predetermined read bit indicates that the read tag has the big tag size or the small tag size.

5. The method of claim 4, the predetermined read bit being the first read bit;

said reading the information about the literal length, copy length, and copy offset including:

in response to the first read bit indicating a small tag size,
reading the second through fourth bits as the literal length,
reading the fifth through eighth bits as the copy length,
reading the eighth through twenty-fourth bits as the copy offset, and
ignoring the remaining read bits of input;

in response to the first read bit indicating a big tag size,
reading the second through seventh bits as the literal length,
reading the eighth through sixteenth bits as the copy length, and
reading the seventeenth through thirty second bits as the copy offset; and said advancing the data read point including
advancing the data read point by the first number of bits when the first read bit indicates a big tag size; and
advancing the data read point by the second number of bits when the first read bit indicates a small tag size.

6. The method of claim 5, where the first number of bits is 32 bits and the second number of bits is 24 bits.

7. The method of claim 1, said processing the literal including:

first determining whether
the literal is less than or equal to a first threshold length,
there are at least a number of bytes equal to the first threshold length in the received input from the data read point, and
there is space available in the output for at least a number of bytes equal to the first threshold length;

in response to satisfying all the conditions of said first determining, writing a number of bytes represented by the first threshold length to the end of the output from the input starting at the data read point;

advancing the data read point by the literal length; and setting the end of the output to be equal to the previous end of the output plus the literal length.

8. The method of claim 7, the method further comprising:

in response to not satisfying all the conditions of said first determining, second determining whether the literal length is equal to a predetermined indicator value;

in response to said second determining indicating that the literal length is equal to the predetermined indicator value, reading a third number of bits from the input as the literal and advancing the data read point by the third number of bits;

third determining, after said second determining, whether
there are at least a number of bytes represented by the literal length remaining in the received input from the data read point, and
there is space available in the output for at least a number of bytes represented by the literal length;

in response to satisfying all the conditions of said third determining, writing a number of bytes represented by the literal length to the end of the output from the input starting at the data read point.

9. The method of claim 1, said establishing a copy read point in the output including:

determining whether the copy read point is set to a location that is before a start of the output; and in response to a determination that the copy read point is set to a location that is before the start of the output, indicating that an error has occurred during the decoding.

10. The method of claim 1, said processing copy data including:

fourth determining whether
the copy length is less than or equal to a second threshold length,
the copy offset is at least a third threshold length, and
there is space available in the output for at least a number of bytes equal to the second threshold length;

said copying information from the copy read point including, in response to satisfying the conditions of said fourth determining, copying a number of bytes equal to the second threshold length to the end of the output from the copy read point; and setting the end of the output to be equal to the previous end of the output plus the copy length.

11. The method of claim 10, said processing copy data including:

in response to not satisfying all the conditions of said fourth determining, fifth determining whether there is space available in the output for a number of bytes represented by the copy length plus a copy buffer amount;

in response to a determination that there is not enough space available for a number of bytes represented by the copy length plus a copy buffer amount, determining whether there is space available in the output for a number of bytes represented by the copy length; and in response to a determination that there is space available in the output for a number of bytes represented by the copy length, copying a number of bytes equal to the copy length to the end of the output from the copy read point.

12. The method of claim 11, the method further comprising:

in response to a determination that there is enough space available for a number of bytes represented by the copy length plus a copy buffer amount, sixth determining whether the copy offset is at least half the maximum permitted copy offset size;

in response to a determination that the copy offset is at least half the maximum permitted copy offset size, copying a number of bytes equal to the copy length to the end of the output from the copy read point.

13. The method of claim 12, the method further comprising:

in response to a determination that the copy offset is not at least half the maximum permitted copy offset size, copying a number of bytes equal to half the maximum permitted literal size to the end of the output from the copy read point;

reducing the copy length by the copy offset;

doubling the copy offset after said copying a number of bytes; and performing said sixth determining after performing said reducing the copy length.

14. The method of claim 9, said establishing a copy read point in the output including setting the copy read point to a value based on a difference between the end of the output and the copy offset.

15. The method of claim 11, the method further comprising:

in response to a determination that there is not enough space available in the output for a number of bytes represented by the copy length, indicating that an error has occurred during the decoding.

16. The method of claim 7, the first threshold length being 16 bytes.

17. The method of claim 10, the third threshold length being 8 bytes.

18. The method of claim 7, where the big tag size is a first number of bits and the small tag size is a second number of bits; and said reading the next tag includes reading a first number of bits of the input starting at the data read point.

19. The method of claim 1, said advancing the data read point including advancing the data read point based on the determined tag size and the literal length.

20. The method of claim 10, the second threshold length being 16 bytes.

21. A non-transitory computer-readable medium having embodied thereon instructions that, when executed by at least one processor, cause the at least one processor to perform a method of decoding computer-readable data from a tag-based data format having a big tag size and a small tag size, the method comprising:

receiving, as input, data comprising a plurality of tags, each tag in said plurality being in the tag-based data format and having either a big tag size or a small tag size;

reading a next tag in the received input, the tag including information about a tag size, a literal length, a literal, a copy length, and a copy offset;

processing the read tag to determine whether the tag has a big tag size or a small tag size, said processing the read tag including reading the information about the literal length, copy length, and copy offset from the tag based on the determined tag size;

processing the literal associated with the tag based on the read information about the literal length, said processing including writing information representing the literal to output representing the decoded computer-readable data, said writing being performed at an end of the output;

processing copy data included in the tag based on the copy length and the copy offset after said processing literal data, said processing including establishing a copy read point in the output based on the copy offset and the end of the output; and copying information from the copy read point to the end of the output based on the copy length;

advancing the data read point based on the determined tag size; and performing a step of determining whether a data read point has passed an end of the received input after said advancing.

22. A system comprising:

a processor; and a processor-readable memory having embodied thereon instructions that, when executed by at least one processor, cause the at least one processor to perform a method of decoding computer-readable data from a tag-based data format having a big tag size and a small tag size, the method comprising:

receiving, as input, data comprising a plurality of tags, each tag in said plurality being in the tag-based data format and having either a big tag size or a small tag size;

reading a next tag in the received input, the tag including information about a tag size, a literal length, a literal, a copy length, and a copy offset;

processing the read tag to determine whether the tag has a big tag size or a small tag size, said processing the read tag including reading the information about the literal length, copy length, and copy offset from the tag based on the determined tag size;

processing the literal associated with the tag based on the read information about the literal length, said processing including writing information representing the literal to output representing the decoded computer-readable data, said writing being performed at an end of the output;

processing copy data included in the tag based on the copy length and the copy offset after said processing literal data, said processing including establishing a copy read point in the output based on the copy offset and the end of the output; and copying information from the copy read point to the end of the output based on the copy length;

advancing the data read point based on the determined tag size; and performing a step of determining whether a data read point has passed an end of the received input after said advancing.

* * * * *